(12) United States Patent
    Nobunaga et al.

(10) Patent No.: US 9,710,182 B2
(45) Date of Patent: *Jul. 18, 2017

(54) APPARATUSES AND METHODS FOR A MEMORY DIE ARCHITECTURE INCLUDING AN INTERFACE MEMORY

(71) Applicant: MICRON TECHNOLOGY, INC., Boise, ID (US)

(72) Inventors: Dean K. Nobunaga, Cupertino, CA (US); Ali Feiz Zarrin Ghalam, Sunnyvale, CA (US); Xiaojiang Guo, San Jose, CA (US); Eric N. Lee, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/942,701

(22) Filed: Nov. 16, 2015

(65) Prior Publication Data

US 2016/0070504 A1    Mar. 10, 2016

Related U.S. Application Data

(63) Continuation of application No. 13/793,347, filed on Mar. 11, 2013, now Pat. No. 9,190,133.

(51) Int. Cl.
    *G06F 12/00*    (2006.01)
    *G11C 11/00*    (2006.01)
    (Continued)

(52) U.S. Cl.
    CPC ............ *G06F 3/0629* (2013.01); *G06F 3/061* (2013.01); *G06F 3/0604* (2013.01);
    (Continued)

(58) Field of Classification Search
    CPC ............... G06F 3/0629; G06F 13/1684; G06F 12/0802; G06F 3/0604; G06F 3/061;
    (Continued)

(56) References Cited

U.S. PATENT DOCUMENTS 6,873,563 B2    3/2005    Suwa et al.
7,466,577 B2    12/2008   Sekiguchi et al.
(Continued)

OTHER PUBLICATIONS

International Search Report and Written Opinion for app. No. PCT/US2014/018915 dated Jul. 7, 2014.

*Primary Examiner* — John A Lane
(74) *Attorney, Agent, or Firm* — Dorsey & Whitney LLP

(57) ABSTRACT

Apparatuses and methods for reducing capacitance on a data bus are disclosed herein. In accordance with one or more described embodiments, an apparatus may comprise a plurality of memories coupled to an internal data bus and a command and address bus, each of the memories configured to receive a command on the command and address bus. One of the plurality of memories may be coupled to an external data bus. The one of the plurality of memories may be configured to provide program data to the internal data bus when the command comprises a program command and another of the plurality of memories is a target memory of the program command and may be configured to provide read data to the external data bus when the command comprises a read command and the another of the plurality of memories is a target memory of the read command.

19 Claims, 6 Drawing Sheets

(51) Int. Cl.
    *G06F 3/06*     (2006.01)
    *G06F 12/0893*     (2016.01)
    *G11C 8/12*     (2006.01)
    *G11C 5/06*     (2006.01)
    *G11C 7/10*     (2006.01)
    *G06F 12/0802*     (2016.01)
    *G06F 13/40*     (2006.01)
    *G06F 13/16*     (2006.01)

(52) U.S. Cl.
    CPC ........ *G06F 3/0683* (2013.01); *G06F 12/0802* (2013.01); *G06F 12/0893* (2013.01); *G06F 13/1684* (2013.01); *G06F 13/4068* (2013.01); *G11C 5/066* (2013.01); *G11C 7/1048* (2013.01); *G11C 8/12* (2013.01); *G11C 11/00* (2013.01); *G06F 2212/1016* (2013.01); *G06F 2212/3042* (2013.01)

(58) Field of Classification Search
    CPC ............... G06F 3/0683; G06F 13/4068; G06F 12/0893; G06F 2212/1016; G06F 2212/3042; G11C 7/1048; G11C 5/066; G11C 8/12; G11C 11/00
    See application file for complete search history.

(56) References Cited

U.S. PATENT DOCUMENTS

| | | | |
|---|---|---|---|
| 7,948,071 | B2 | 5/2011 | Thomas et al. |
| 8,108,647 | B2 * | 1/2012 | Bartley ................. G06F 11/201 711/170 |
| 2004/0225770 | A1 | 11/2004 | Lee et al. |
| 2005/0177695 | A1 | 8/2005 | Larson et al. |
| 2005/0254332 | A1 | 11/2005 | Klein |
| 2008/0043565 | A1 | 2/2008 | Cullum et al. |
| 2009/0138665 | A1 | 5/2009 | Suzuki |
| 2009/0296468 | A1 | 12/2009 | Khaef |
| 2012/0218803 | A1 | 8/2012 | Jeddeloh |
| 2012/0233395 | A1 | 9/2012 | Smith et al. |
| 2012/0268982 | A1 | 10/2012 | Rajan |
| 2013/0111287 | A1 | 5/2013 | Chao |
| 2014/0258619 | A1 | 9/2014 | Nobunaga et al. |

\* cited by examiner

APPARATUSES AND METHODS FOR A MEMORY DIE ARCHITECTURE INCLUDING AN INTERFACE MEMORY

CROSS-REFERENCE TO RELATED APPLICATION

This application is a continuation of U.S. patent application Ser. No. 13/793,347, filed Mar. 11, 2013. This application is incorporated by reference herein in its entirety and for all purposes.

TECHNICAL FIELD

Embodiments of the present invention relate generally to semiconductor memory, and more specifically, in one or more described embodiments, to reducing capacitance on a data bus.

BACKGROUND

As operating speeds and complexity of devices, such as memories, have increased, rates at which data is provided to and received from these devices have also increased. Such increases in data rates, however, are not without their drawbacks. For example, increases in data rates and/or an increasing average number of components in systems have led to increased capacitance on signal busses, for instance, on data busses and data strobe busses. Because the presence of capacitance in excess of particular thresholds may compromise data integrity within a bus or between busses, capacitance can often limit the rate at which data may be provided.

To account for this, several different approaches have been utilized. Wider busses using lower data rates and various bus terminations are examples of ways in which artisans have attempted to address this problem. Yet these and other approaches may not always be feasible solutions due to a variety of reasons, such as available physical space in a device or cost.

DETAILED DESCRIPTION

Apparatuses and methods for reducing capacitance on a data bus are disclosed herein. Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
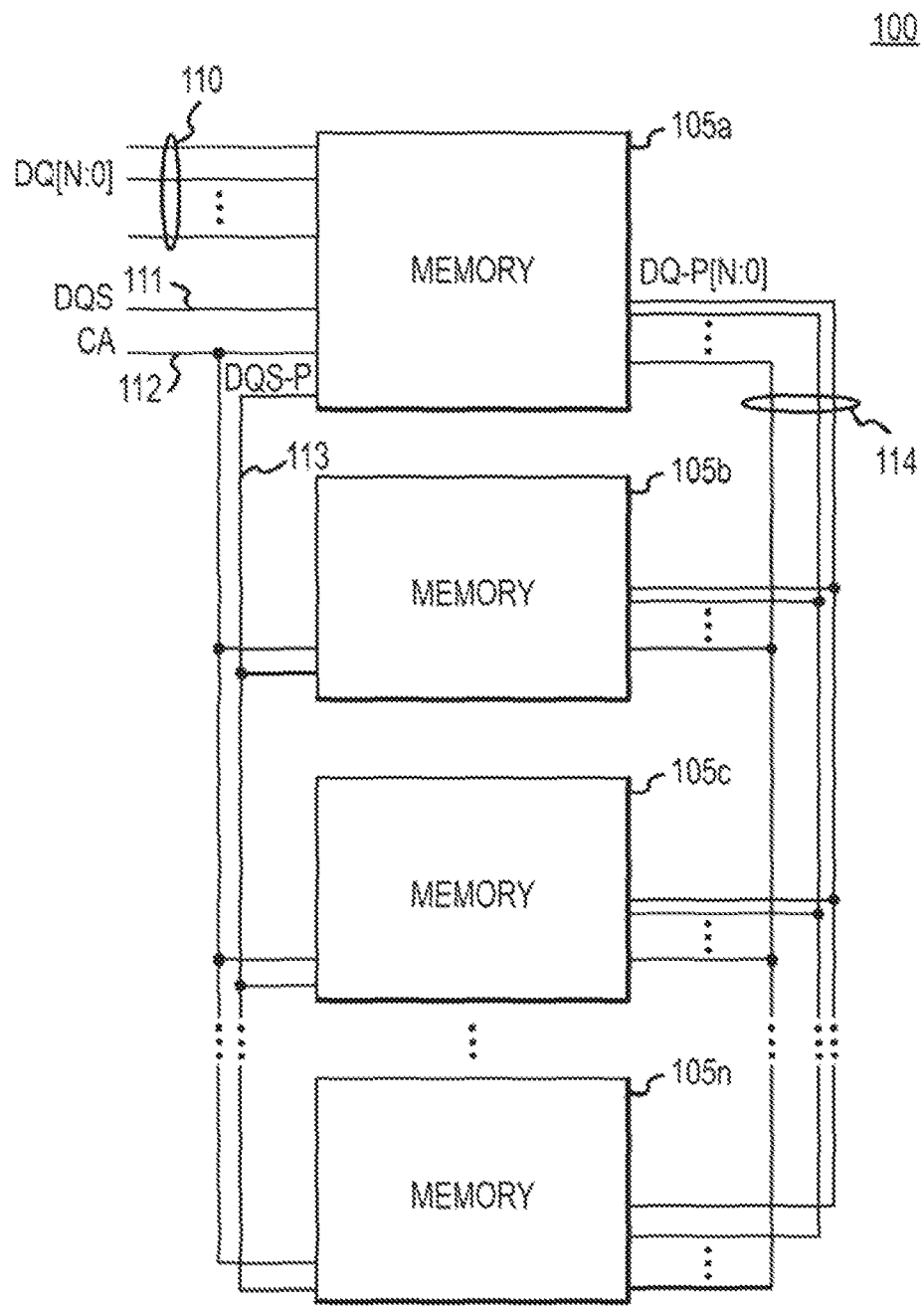
FIG. 1 is a block diagram of an apparatus according to an embodiment of the invention.

FIG. 1 is a block diagram of an apparatus 100 according to an embodiment of the invention. Examples of apparatuses may include an integrated circuit, a memory device, a memory system, an electronic device or system, a smart phone, a tablet, a computer, a server, etc. The apparatus 100 may include a plurality of memories 105, each of which may be configured to store data and/or perform one or more memory operations (e.g., program, read, or erase memory operations). While the apparatus 100 is illustrated as including four memories 105, it will be appreciated that the apparatus 100 may include any number of memories 105, such as 2, 4, 8, or 16. In at least one embodiment, the memories 105 may comprise non-volatile memory, such as NAND or NOR flash memory, and some embodiments may additionally or alternatively comprise other types of memory, such as phase change memory (PCM) or dynamic random access memory (DRAM). In some instances, each of the memories 105 may be substantially the same.

One of the memories 105 (e.g., memory 105a) may be an "interface memory" such that the memory 105 may be configured to provide data to and/or receive data from one or more devices external to the apparatus 100, such as a memory controller (not shown in FIG. 1). The remaining memories 105 of the apparatus 100 may be "internal memories." Each internal memory 105 may be configured to provide data to and receive data from one or more other memories 105 in the apparatus 100. In one embodiment and as will be described, each of the memories 105 may be configured to provide data to other memories 105 while operating in a read mode and may be configured to receive data from other memories 105 while operating in a data input mode. While the memory 105a is described herein as comprising an interface memory, it will be appreciated that in other embodiments any memory 105 of the apparatus 100 may be an interface memory or an internal memory and described examples are not intended to be limiting in any manner.

In at least one embodiment, the interface memory 105 (e.g., memory 105a) may be coupled to an external data bus 110 and configured to receive data from and/or provide data over the bus 110. The bus 110 may have a width of N bits, where N corresponds to any desired number of bits including 8, 16, 32, or 64 bits. The interface memory 105 may further be configured to receive a data strobe signal DQS over bus 111, and/or to provide a data strobe signal DQS-P to each of the memories 105 over a bus 113. The DQS-P signal may be based, at least in part, on the DQS signal and in at least one embodiment may be the same the DQS signal that is received. In another embodiment, the DQS-P signal may be phase shifted relative to the DQS signal. Memories 105 may perform operations based, at least in part, on the DQS and/or DQS-P signals. For example, the DQS signal and the DQS-P signal may be used to clock data info the interface memory 105 and the internal memories 105, respectively.

Each of the memories 105 may be coupled to an internal data bus 114 over which data may be provided between the interface memory 105 and each of the internal memories 105. The bus 114 may have any bit width, and in at least one embodiment, may have a same width as the bus 110 (e.g., N bits). Each of the memories 105 may further be configured to receive one or more command and address signals CA over a command and address bus 112. The CA signals may comprise a command and an address associated with the command. In at least one embodiment, the CA signals may be provided serially over the bus. Each of the memories 105 may be configured to receive the CA signals and determine if the included address corresponds to a memory location of the memory 105. For example, in one embodiment, the address may include a logical unit number (LUN) indicating which memory is intended to perform the command. The command and address bus 112, in some embodiments, may be a single bus over which command and/or address signals may be multiplexed. In other embodiments, the command and address bus 112 may comprise a plurality of busses over which command and/or address signals are provided to one or more memories 105. In some instances, the bus 112 may further be used in a testing mode, for example, wherein data may also be provided over the bus 112 to one or more of the memories 105.

In an example operation of the apparatus 100, CA signals are provided to each of the memories 105 over the bus 112, and may, for instance, be from a memory controller. As described, the CA signals may include a command and an address associated with the command. In response, each of the memories 105 may determine whether the address corresponds to a memory location in the respective memory 105. If so, the respective memory 105 is considered the "target memory" and may perform the command.

By way of example, if the interlace memory 105a is the target memory, the interface memory 105a may perform the command such that data is programmed in the interface memory 105a (e.g., during a program command), provided from the interface memory 105a (e.g., during a read command), and/or data programmed in the interface memory 105 is erased (e.g., erase command). As described, commands performed by the interface memory 105 may be performed based, at least in part, on the DQS signal.

Moreover, as will be described in more detail below, if the target memory is not the interface memory 105, the command may be performed by an internal memory 105. During a program command, for example, data intended for programming in the target memory 105 may be provided to the interface memory 105a over bus 110, and subsequently provided to the target memory 105 over the bus 114. The interface memory 105a may cache the data before providing the data to an internal memory 105 or may provide data to an internal memory 105 without doing so, for instance, by pipelining the data between busses 110, 114. As used herein, forms the term caching (e.g., cache, cached, etc.) may refer to storing, caching, buffering, and/or latching data. The interface memory 105a may, for instance, cache up to a page of data at one time. During a read command, data may be provided from the target memory 105 to the interface memory 105a over the bus 114, and thereafter provided by the interface memory 105 to the bus 110. The interface memory 105a may cache the data before providing the data to the bus 110 or may provide the data to the bus 110 without doing so. Because no data is provided over the bus 114 for an erase command, internal memories 105 may perform erase commands in the same manner as the interface memory 105a. As described, commands performed by internal memories 105 may be performed based, at least in part, on the DQS-P strobe signal. In some embodiments, a data cache is included in at least the interface memory 105a to cache data received from the bus 110 before providing the data to itself or the memories 105 (e.g., on the bus 114) and/or to cache data received from on the bus 114 or from itself before providing the data to the bus 110.

In this manner, memory commands, such as program commands, read commands, and erase commands, may be performed by one or more of the memories 105 of the apparatus 100. In one embodiment, providing data to and/or receiving data from each of the internal memories 105 with the interface memory 105 may reduce the number of devices coupled to the bus 110. Accordingly, the capacitance resulting from operation of the bus 110 may be reduced, thereby improving performance and signal integrity. The bus 114 may also have a relatively lower capacitance, for example, due to the length of the bus 114, the number of devices coupled to the bus 114, the device impedance of the devices coupled to the bus 114, and/or other factors. As a result, the circuitry of the memories 105 coupled to the bus 114 for receiving and providing signals over the bus 114 may be optimized for the relatively lower capacitance. For example, the drive strength of the circuitry may be lower than that needed for circuitry for driving signals on a bus having higher capacitance, for example, bus 110.

Figure 2:
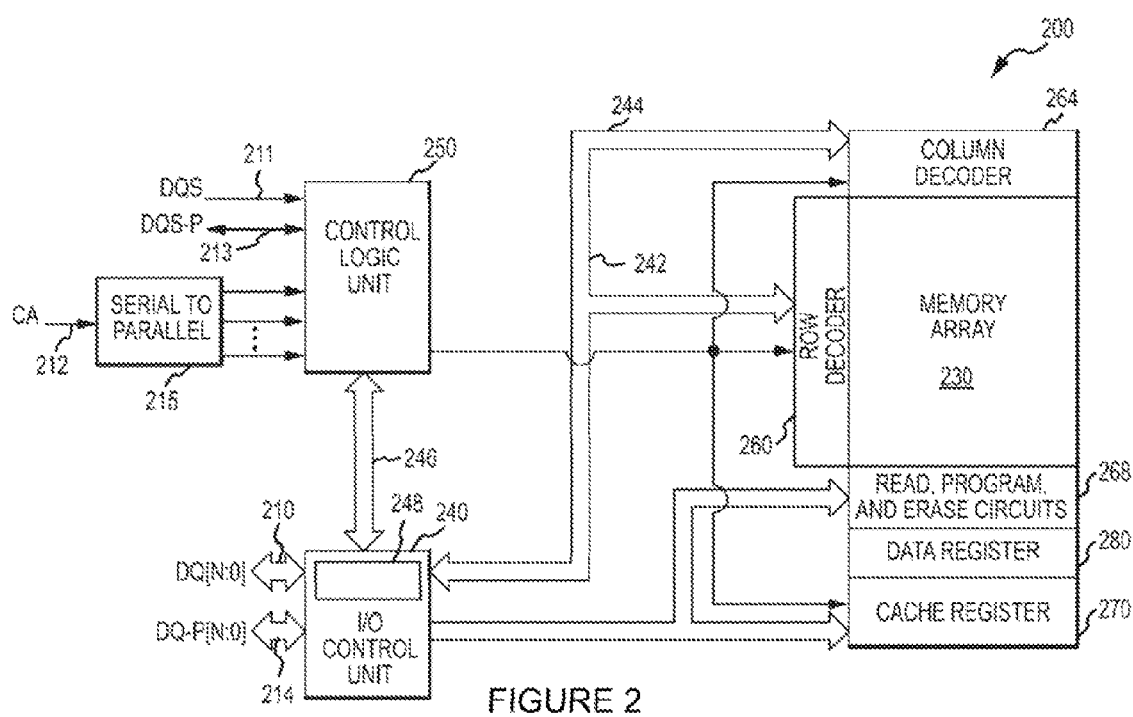
FIG. 2 is a block diagram of a portion of a memory according to an embodiment of the invention.

FIG. 2 is a block diagram of a memory 200 according to an embodiment of the present invention. The memory 200 may be used to implement one or more of the memories 105, including an interface memory and/or an internal memory.

Data may be provided to and/or received from the memory 200 as respective sets of sequential input/output ("I/O") signals transmitted over one or more of the busses 210, 214. The busses 210, 214 may/be connected to an I/O control unit 240 that routes data between the busses 210, 214 and/or other components of the memory 200. The memory 200 also may include a control logic unit 250 that may receive a strobe signal DQS, a strobe signal DQS-P, and command and address signals CA over busses 211, 213, and 212, respectively. Each of the DQS, DQS-P, and CA signals may be used for operating the memory 200, as described with respect to a memory 105 of FIG. 1.

The memory 200 may include an array 230 of memory cells that may be flash memory cells, but may additionally or alternatively be DRAM, SDRAM, or any other type of memory cells. Moreover, the memory 200 may include an address bus 244 that applies block-row address signals to a row decoder 260 and column address signals to a column decoder 264. Block-row and column addresses may be based, at least in part, on the address of an address signal included in received CA signals. The row decoder 260 and column decoder 264 may be used to select blocks of memory or memory cells for memory operations, for example, read, program, and erase memory operations. The column decoder 264 may enable data to be applied to columns of memory corresponding to the column address signals and allows data to be coupled from columns of memory corresponding to the column address signals.

In response to the memory commands decoded by the control logic unit 250, the memory cells in the array 230 may be read, programmed, or erased. Read, program, and erase circuits 268 coupled to the memory array 230 may receive control signals from the control logic unit 250 and include voltage generators for generating various pumped voltages for read, program and erase operations.

During a program operation, after the row address signals have been applied to the address bus 244, the I/O control unit 240 routes data to a cache register 270. The data are cached in the cache register 270 in successive sets each having a size corresponding to the width of the busses 210, 214. The cache register 270 sequentially stores the sets of data for an entire row or page of memory cells in the array 230. All of the stored data are then used to program a row or page of memory cells in the array 230 selected by the block-row address coupled through the address bus 244. In a similar manner, during a read operation, data signals from a row or block of memory cells selected by the block-row address coupled through the address bus 244 are stored in a data register 280. Sets of data corresponding in size to the width of the busses 210, 214 are then sequentially transferred through the I/O control unit 240 from the data register 280 to one or more of the busses 210, 214. The memory 200 may further include a data cache, for example, data cache 248, that may cache data from the bus 210 to be provided to the internal data bus 214 and/or cache data from the bus 214 to be provided to the bus 210. Additionally, or alternatively, the memory 200 may use the cache register 270 and/or data register 280 to cache data from the bus 210 to be provided to the 214 and/or cache data from the bus 214 to be provided to the bus 210.

As described, commands and addresses of CA signals may be provided in a serial manner. In at least one embodiment, however, the control logic unit 250 may be configured to decode command signals provided in parallel. As a result, the memory 200 may include a serial-to-parallel shifter 215 such that commands and/or addresses are received partially or fully in parallel by the control logic unit 250. In some embodiments, the serial-to-parallel shifter 215 may be included in the control logic unit 250 or may be included in any other component of the memory 200.

In another embodiment, commands and/or addresses of the CA signals provided to the control logic unit may be provided in accordance with a serial command protocol. For example, each of a plurality of serial commands may correspond to conventional commands known in the art. The control logic unit 250 may include command decode logic that may be configured to decode the serially received commands into corresponding program, erase, and read commands, as well as any other commands known in the art, such that the commands may be performed by the memory 200.

With respect to the apparatus 100 of FIG. 1, in some instances it may be desirable for each of the memories 105 to be substantially the same. It may be more efficient, for example, to manufacture a single memory design instead of multiple memory designs, such as, one memory design for interface memories and another memory design for internal memories. In this manner, any memory 105 of the apparatus 100 may be configured to operate as the interface memory. Thus, while each of the memories 105 may compose a memory 200, it will be appreciated that an interface memory 105 may utilize a different plurality of the described features of a memory 200 than an internal memory. By way of example, the busses 210 and 214 may correspond to busses 110, 114 of FIG. 1, respectively. Accordingly, the interface memory 200 may be configured to provide and/or receive data using both busses 210 and 214, and the internal memory 200 may be configured to provide and/or receive data using only the bus 214. Moreover, the interface memory 200 may be configured to receive a data strobe signal DQS and provide a data strobe signal DQS-P, and the internal memory 200 may be configured to receive only the data strobe signal DQS-P.

Figure 3:
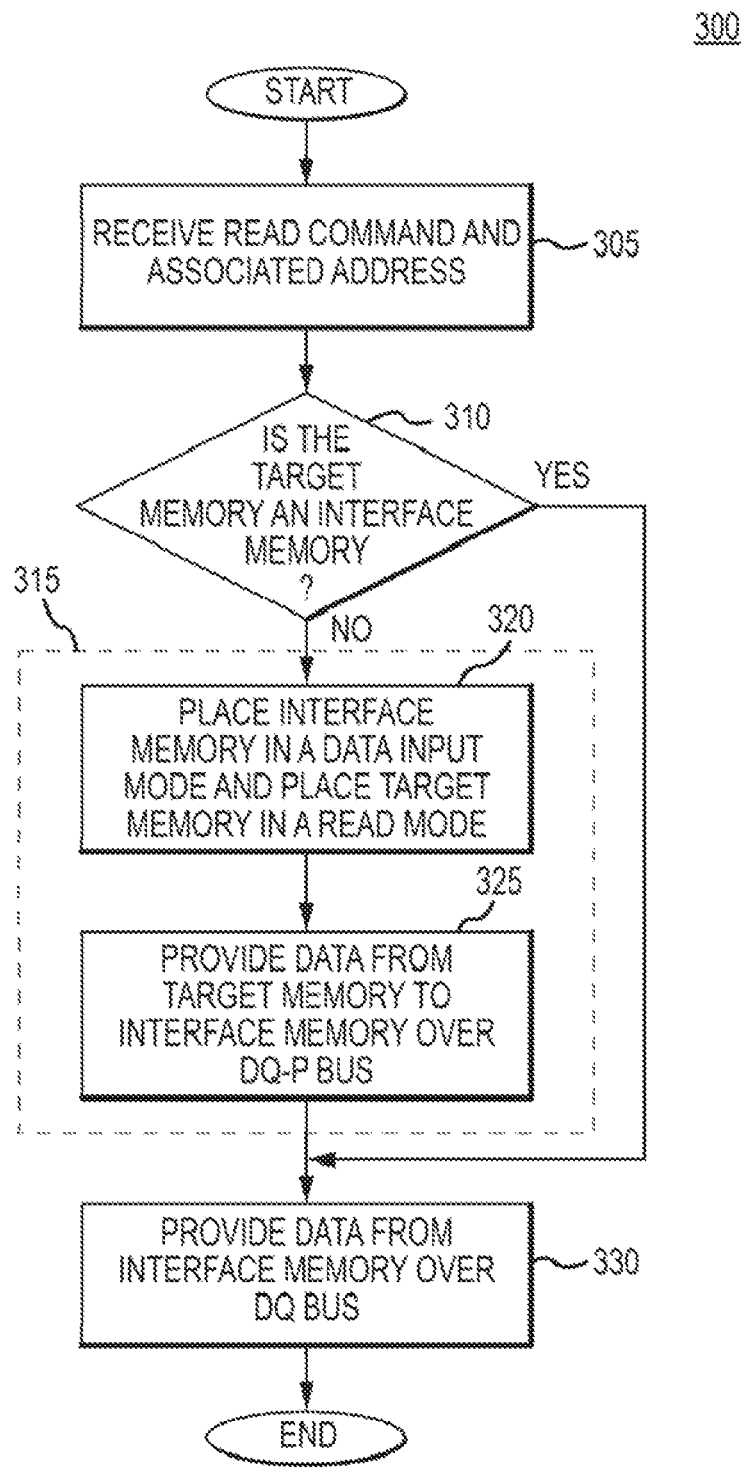
FIG. 3 is a flowchart diagram of a method for performing a read operation according to an embodiment of the invention.

FIG. 3 is a flowchart diagram of a method 300 for performing a read operation according to an embodiment of the invention. The method 300 may be implemented by the apparatus 100 of FIG. 1. At step 305, command and address signals CA including a read command and an associated address may be provided to the memories 105, for instance, over the bus 112. At step 310, each of the memories 105 may determine whether it is the target memory for the read command. For example, each memory 105 may determine if the address associated with the read command corresponds to a memory location in the respective memory 105.

If the interface memory 105a is the target memory, at step 330, data (e.g., read data) from the memory location corresponding to the address may be provided from the interface memory 105a over the bus 110, for instance, to an external device as described.

If the interface memory 105a is not the target memory, at step 315, data from the memory location corresponding to the address may be provided from the target memory to the interface memory 105. For example, at step 320, the interface memory 105a may be placed (e.g., operate) in a data input mode and the target memory may be placed in a read mode. The interface memory 105a may be configured to receive and/or cache the data from the target memory 105 when placed in the data input mode, and the target memory may be configured to provide the data to the interface memory 105a when placed in the read mode. Subsequently, at step 325, data may be provided from the target memory to the interface memory 105a over the bus 114. Once data has been provided from the target memory to the interface memory 105a, the data may be provided from the interface memory 105a over the bus 110.

Figure 4:
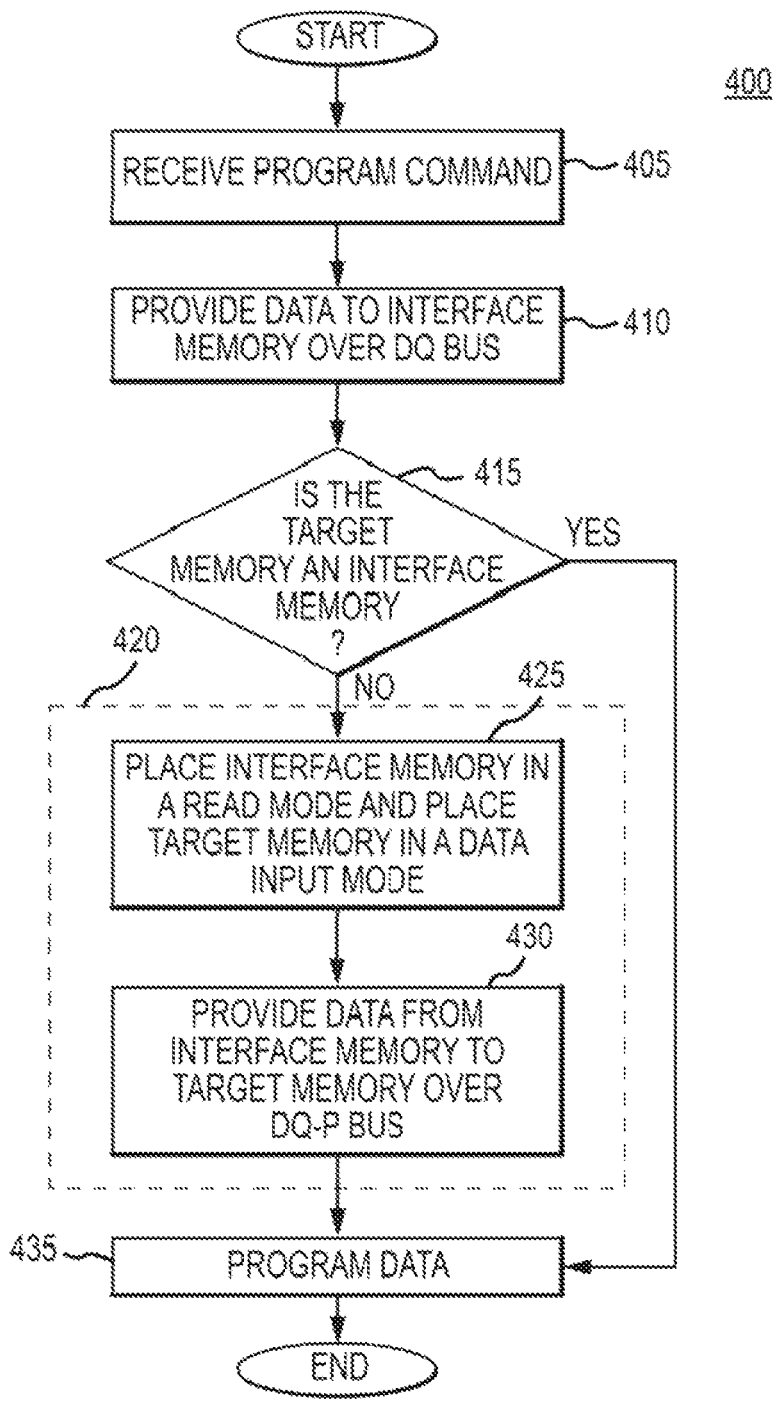
FIG. 4 is a flowchart diagram of a method for performing a programming operation according to an embodiment of the invention.

FIG. 4 is a flowchart diagram of a method 400 for performing a programming operation according to an embodiment of the invention. The method 400 may be implemented by the apparatus 100 of FIG. 1. At step 405, a program command and an associated address may be provided to the memories 105, for instance, over the bus 112. At step 410, data (e.g., program data) associated with the program command may be provided to the interface memory 105a over the bus 110. At step 415, each memory 105 may determine whether the address associated with the program command corresponds to a memory location in the respective memory 105.

If the target memory is the interface memory 105a, no other data transfers are necessary as the data has already been provided to the target memory and will be programmed accordingly at the step 435.

If the target memory is not the interface memory 105a, at step 420, data may be programmed at the memory location in the target memory corresponding to the address associated with the program command. For example, at step 425, the interface memory 105a may be placed in a read mode and the target memory may be placed in a data input mode. The interface memory 105a may be configured to provide data to the target memory, for example from a cache of the interface memory 105a, when placed in the read mode. The target memory may be configured to receive and/or program the data from the interface memory 105 when placed in the data input mode. For example, at step 430, data may be provided from the interface memory 105a to the target memory over the bus 114 and thereafter programmed at the memory location associated with the address in the target memory at the step 435.

Figure 5:
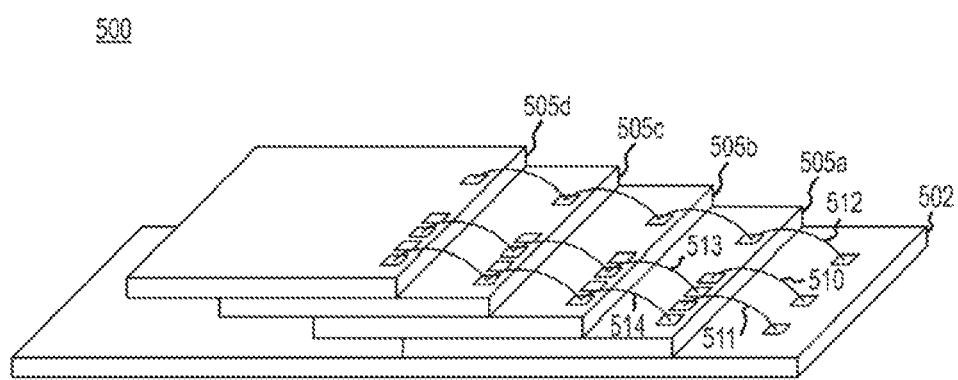
FIG. 5 is a perspective view diagram of a die stack according to an embodiment of the invention.

FIG. 5 is a perspective view diagram of a die stack 500 according to an embodiment of the invention. The die stack 500 may include a plurality of dies 505 and a substrate 502. Each of the plurality of dies 505 may comprise a memory, such as a memory 105 of FIG. 1 or a memory 200 of FIG. 2. Each of the busses 510, 511, and 512 may be coupled through a substrate 502 to an external device, as previously described. While the busses 510-514 are shown as a single conductor, it will be appreciated that each of the busses 510 may have any width (e.g., includes several conductors) and are shown as a single conductor for the purposes of clarity.

As illustrated, the dies 505 may be arranged in a die stack and positioned on the substrate 502. While the dies 505 of the die stack 500 are shown as being staggered such that bond wires of the busses 510-514 of the die stack 500 may be coupled to respective bond pads of respective dies 505, it will be appreciated that some or all of the dies may be vertically stacked such that dies are coupled using other methods, such as through silicon vias (TSVs). In at least one embodiment, the die 505a may comprise an interface memory and dies 505b-d may comprise internal memories. That is, die 505a may be configured to receive data from and provide data to the bus 510 and dies 505b-c may be configured to receive data from and provide data to the die 505a over the bus 514. Moreover, in at least one embodiment, the command and address bus 512 may comprise one or more pads on each of the dies 505. Each die 505 may, for instance, receive command and/or address signals in accordance with a serial command protocol via the pads.

Figure 6:
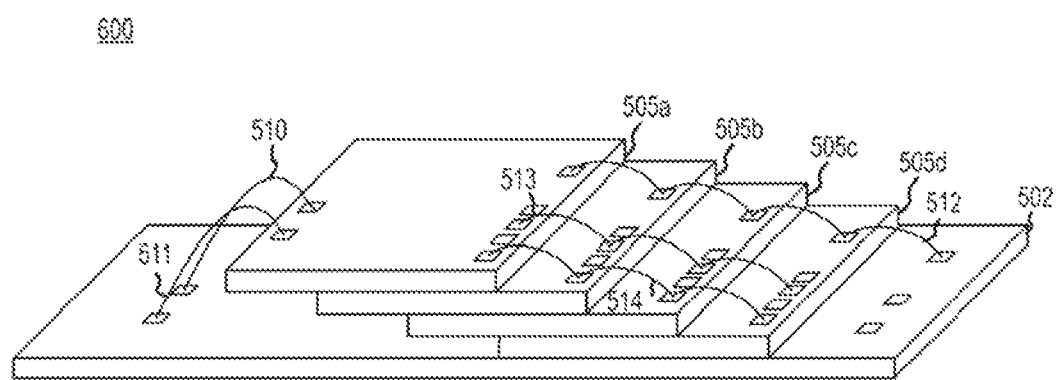
FIG. 6 is a perspective view diagram of a die stack according to an embodiment of the invention.

FIG. 6 is a perspective view diagram of a die stack 600 according to an embodiment of the invention. The die stack 600 includes elements that have been previously described with respect to the die stack 500 of FIG. 5. Those elements have been shown in FIG. 6 using the same reference numbers used in FIG. 5 and operation of the common elements is as previously described. Consequently, a detailed description of the operation of these elements will not be repeated in the interest of brevity.

In contrast to the die stack 500 of FIG. 5, the die stack 600 may include a die 505a having a top position of the die stack 600. In one such embodiment, busses 510, 511 and busses 512, 513, 514 may be coupled to opposite ends of a surface of the die 505a. Bond pads for the busses 510 and 511 may be located on the substrate 502 and the dies 505 to facilitate connection therebetween for the embodiment shown in FIG. 6. In comparison to the embodiment shown in FIG. 5, the bond pads on the substrate 502 and the dies 505 for the embodiment shown in FIG. 6 are in different locations. The interface memory may be positioned at a bottom position, top position, or an intermediate position within the stack without departing from the scope of the present invention. The specific embodiments described with reference to FIGS. 5 and 6 have been provided merely as examples, and is not intended to limit the scope of the present invention to the specific embodiments.

From the foregoing it will be appreciated that, although specific embodiments of the invention have been described herein for purposes of illustration, various modifications may be made without deviating from the spirit and scope of the invention. Accordingly, the invention is not limited to the specific embodiments of the invention describe herein.

What is claimed is:

1. An apparatus, comprising:
a plurality of memories coupled in parallel to an internal data bus and further coupled to a command and address bus and configured to receive a command on the command and address bus;
wherein one of the plurality of memories is coupled to an external data bus, the one of the plurality of memories configured to provide program data to a target memory over the internal data bus when the command comprises a program command and another of the plurality of memories is the target memory of the program command.

2. The apparatus of claim 1, wherein each of the plurality of memories is configured to determine whether it is the target memory responsive to receiving the command.

3. The apparatus of claim 2, wherein the target memory is configured to be placed in a data input mode responsive to determining that it is the target memory.

4. The apparatus of claim 1, wherein the one of the plurality of memories is configured to be placed in a read mode to provide the program data to the target memory.

5. The apparatus of claim 1, wherein the one of the plurality of memories is configured to receive an external data strobe signal and provide an internal data strobe signal to the target memory.

6. The apparatus of claim 5, wherein the target memory is configured to perform the program command based, at least in part, on the internal data strobe signal.

7. The apparatus of claim 1, wherein the external data bus has a first bit width and the internal data bus has a second bit width that is the same as the first bit width.

8. An apparatus, comprising:
a plurality of memories coupled in parallel to an internal data bus and further coupled to a command and address bus, the plurality of memories configured to receive a command on the command and address bus,
wherein a memory of the plurality of memories is coupled to an external data bus, the memory of the plurality of memories configured to provide read data to the external data bus from a target memory, the read data received over the internal data bus, and
wherein the target memory of the read command is included in the plurality of memories.

9. The apparatus of claim 8, wherein the memory of the plurality of memories is configured to be placed in a data input mode responsive to determining that the command is a read command.

10. The apparatus of claim 8, wherein the target memory is placed in a read mode responsive to determining that it is the target memory.

11. The apparatus of claim 8, wherein the memory of the plurality of memories is configured to cache the read data prior to providing the read data to the external data bus.

12. The apparatus of claim 8, wherein the memory of the plurality of memories is configured to receive an external data strobe signal and to provide an internal data strobe signal to the target memory, and the target memory is configured to provide the read data to the memory of the plurality of memories based, at least in part, on the internal data strobe signal.

13. An apparatus, comprising:
an interface memory coupled to an external data bus and an internal data bus; and
a plurality of internal memories coupled in parallel to the internal data bus and further coupled to a command and address bus and configured to receive a command and an address,
wherein the plurality of internal memories are configured to identify a target memory based on the address and to communicate with the interface memory via the internal data bus responsive to the command.

14. The apparatus of claim 13, wherein the target memory is configured to be placed in a data input mode responsive to determining that the command is a program command.

15. The apparatus of claim 14, wherein the interface memory is configured to receive program data via the external data bus and provide the program data to the target memory via the internal data bus.

16. The apparatus of claim 13, wherein the interface memory is configured to be placed in a data input mode responsive to determining that the command is a read command.

17. The apparatus of claim 16, wherein the interface memory is configured to receive read data from the target memory via the internal data bus and provide the read data via the external data bus.

18. The apparatus of claim 13, wherein the interface memory is configured to cache data associated with the command and received through one of the external data bus and the internal data bus.

19. The apparatus of claim 13, wherein the plurality of internal memories are configured to identify the target memory based, at least in part, on an address associated with the target memory.

* * * * *